(12) United States Patent
Sassiat et al.

(10) Patent No.: US 8,999,803 B2
(45) Date of Patent: Apr. 7, 2015

(54) METHODS FOR FABRICATING INTEGRATED CIRCUITS WITH THE IMPLANTATION OF FLUORINE

(71) Applicant: GLOBALFOUNDRIES Singapore Pte. Ltd., Singapore (SG)

(72) Inventors: Nicolas Sassiat, Dresden (DE); Shiang Yang Ong, Singapore (SG); Ran Yan, Dresden (DE); Torben Balzer, Dresden (DE)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/906,805

(22) Filed: May 31, 2013

(65) Prior Publication Data

US 2014/0357028 A1    Dec. 4, 2014

(51) Int. Cl.
*H01L 21/336* (2006.01)
*H01L 21/8238* (2006.01)

(52) U.S. Cl.
CPC ... *H01L 21/823807* (2013.01); *H01L 21/823814* (2013.01)

(58) Field of Classification Search
USPC .......... 438/305, 306, 307, 299, 301, 303
See application file for complete search history.

(56) References Cited

U.S. PATENT DOCUMENTS

| | | | | |
|---|---|---|---|---|
| 6,312,998 B1* | 11/2001 | Yu | ............................... | 438/303 |
| 7,456,448 B2* | 11/2008 | Kotani et al. | ................. | 257/224 |
| 7,557,022 B2* | 7/2009 | Nandakumar et al. | ........ | 438/527 |
| 7,776,680 B2* | 8/2010 | Basker et al. | ................. | 438/231 |
| 2008/0315351 A1* | 12/2008 | Kakehata | ....................... | 257/507 |
| 2012/0156837 A1 | 6/2012 | Scheiper et al. | | |
| 2012/0202326 A1* | 8/2012 | Kronholz et al. | ............. | 438/231 |

* cited by examiner

*Primary Examiner* — Reema Patel
(74) *Attorney, Agent, or Firm* — Ingrassia Fisher & Lorenz, P.C.

(57) ABSTRACT

A method for fabricating an integrated circuit includes forming a first gate electrode structure above a first active region and a second gate electrode structure above a second active region, forming a sacrificial spacer on sidewalls of the first and second gate electrode structures, and forming deep drain and source regions selectively in the first and second active regions by using the sacrificial spacer as an implantation mask. The method further includes forming drain and source extension and halo regions in the first and second active regions after removal of the sacrificial spacer and forming a fluorine implant region in the halo region of the first active region before or after formation of the drain and source extension and halo regions.

9 Claims, 9 Drawing Sheets

METHODS FOR FABRICATING INTEGRATED CIRCUITS WITH THE IMPLANTATION OF FLUORINE

TECHNICAL FIELD

The present disclosure generally relates to semiconductor devices and methods for fabricating semiconductor devices, and more particularly the present disclosure relates to methods for fabricating integrated circuits with the implantation of fluorine into source/drain extension regions.

BACKGROUND

In modern integrated circuits, a very high number of individual circuit elements, such as field effect transistors in the form of CMOS, NMOS, PMOS elements, resistors, capacitors and the like, are formed on a single chip area. Typically, feature sizes of these circuit elements are steadily decreasing with the introduction of every new circuit generation to provide currently available integrated circuits with a high performance in terms of speed and/or power consumption. A reduction in size of transistors is an important aspect in steadily improving device performance of complex integrated circuits, such as CPUs. The reduction in size commonly brings about an increased switching speed, thereby enhancing signal processing performance.

Moreover, the continuous drive to shrink the feature sizes of complex integrated circuits has resulted in a gate length of field effect transistors of approximately 50 nm and less. A field effect transistor, irrespective of whether an N-channel transistor or a P-channel transistor is considered, typically comprises so-called "PN junctions" that are formed by an interface of highly doped regions, referred to as "drain" and "source" regions, with a slightly doped or non-doped region, referred to as a "channel" region, that is disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon forming a conductive channel due to the application of an appropriate control voltage to the gate electrode, depends on the dopant concentration of the drain and source regions, the mobility of the charge carriers and, for a given transistor width, on the distance between the source region and the drain region, which is also referred to as "channel length."

Presently, most of the complex integrated circuits are based on silicon, due to the substantially unlimited availability, the well understood characteristics of silicon and related materials and processes, and due to the experience gathered during the last 50 years. Therefore, silicon will likely remain the material of choice for future circuit generations. One reason for the important role of silicon for the fabrication of semiconductor devices has been the superior characteristics of a silicon/silicon dioxide interface that allows a reliable electrical insulation of different regions from each other. The silicon/silicon dioxide interface is stable at high temperatures and, thus, allows high temperature processes to be performed, as are typically required for anneal processes in order to activate dopants and to cure crystal damage without sacrificing the electrical characteristics of the interface. Consequently, in field effect transistors, silicon dioxide has been preferably used as a gate insulation layer which separates the gate electrode, frequently comprised of polysilicon, from the silicon channel region. Upon further device scaling, however, the reduction of channel length may require a corresponding adaptation of the thickness of the silicon dioxide gate dielectric in order to substantially avoid a so-called "short channel" behavior, according to which a variability in channel length may have a significant influence on the resulting threshold voltage of the transistor. Aggressively scaled transistor devices with a relatively low supply voltage and, thus, a reduced threshold voltage, therefore, suffer from a significant increase of the leakage current caused by the reduced thickness of a silicon dioxide gate dielectric. For example, a channel length of approximately 0.08 µm may require a gate dielectric made of silicon dioxide as thin as approximately 1.2 nm in order to maintain the required capacitive coupling between the gate electrode and the channel region. Although high speed transistor elements having an extremely short channel may, in general, preferably be used in high speed signal paths, wherein transistor elements with a longer channel may be used for less critical signal paths (for instance, such less critical transistors may be used as storage transistors), the relatively high leakage current caused by the direct tunneling of charge carriers through the ultra-thin silicon dioxide gate dielectric of the high speed transistor elements may reach values for an oxide thickness in the range of 1-2 nm and may no longer be compatible with thermal design power requirements for any type of complex integrated circuit system.

For this reason, replacing silicon dioxide as the material for gate insulation layers has been considered, particularly for highly sophisticated applications. Possible alternative materials include such materials that exhibit a significantly higher permittivity, so that a physically greater thickness of a correspondingly formed gate insulation layer provides a capacitive coupling that would be obtained by an extremely thin silicon dioxide layer. It has been suggested to replace silicon dioxide with high permittivity materials, such as tantalum oxide, strontium titanium oxide, hafnium oxide, hafnium silicon oxide, zirconium oxide and the like.

Additionally, transistor performance may further be increased by providing an appropriate conductive material for the gate electrode in order to replace the usually used polysilicon material, since polysilicon may suffer from charge carrier depletion at the vicinity of the interface positioned between the gate dielectric material and the polysilicon material, thereby reducing the effective capacitance between the channel region and the gate electrode during transistor operation. Thus, a gate stack has been suggested in which a high-k dielectric material provides enhanced capacitance, while additionally maintaining any leakage currents at an acceptable level. Since the non-polysilicon material, such as titanium nitride and the like, may be formed such that it may be in direct contact with gate dielectric material, the presence of a depletion zone may, thus, be avoided, while, at the same time, a moderately high conductivity may be achieved.

As is well known, the threshold voltage of the transistor may depend on the overall transistor configuration, on the complex lateral and vertical dopant profile of the drain and source regions, the corresponding configuration of the PN junctions and on the work function of the gate electrode material. Current dopants used the source/drain regions have been known to cause interstitial defects in the semiconductor substrate, thus reducing device performance. Further, the dopants, once implanted, have been known to diffuse through the semiconductor substrate, thus also reducing device performance.

Accordingly, it is desirable to provide integrated circuits with small-scale transistor structures and methods for fabricating the same with improved carrier mobility and drive current. Further, it is desirable to provide methods for fabricating integrated circuits that reduce interstitial defects and dopant diffusion in the source/drain regions. Furthermore, other desirable features and characteristics of the present invention will become apparent from the subsequent detailed description of the invention and the appended claims, taken in conjunction with the accompanying drawings, the brief summary, and this background of the invention.

BRIEF SUMMARY

Semiconductor devices and methods for fabricating semiconductor devices are disclosed herein. In accordance with an exemplary embodiment, a method for fabricating an integrated circuit includes forming a first gate electrode structure above a first active region and a second gate electrode structure above a second active region, forming a sacrificial spacer on sidewalls of the first and second gate electrode structures, and forming deep drain and source regions selectively in the first and second active regions by using the sacrificial spacer as an implantation mask. The method further includes forming drain and source extension and halo regions in the first and second active regions after removal of the sacrificial spacer and forming a fluorine implant region in the halo region of the first active region before or after formation of the drain and source extension and halo regions.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The present invention will hereinafter be described in conjunction with the following drawing figures, wherein like numerals denote like elements, and wherein.

DETAILED DESCRIPTION

Figure 1A:
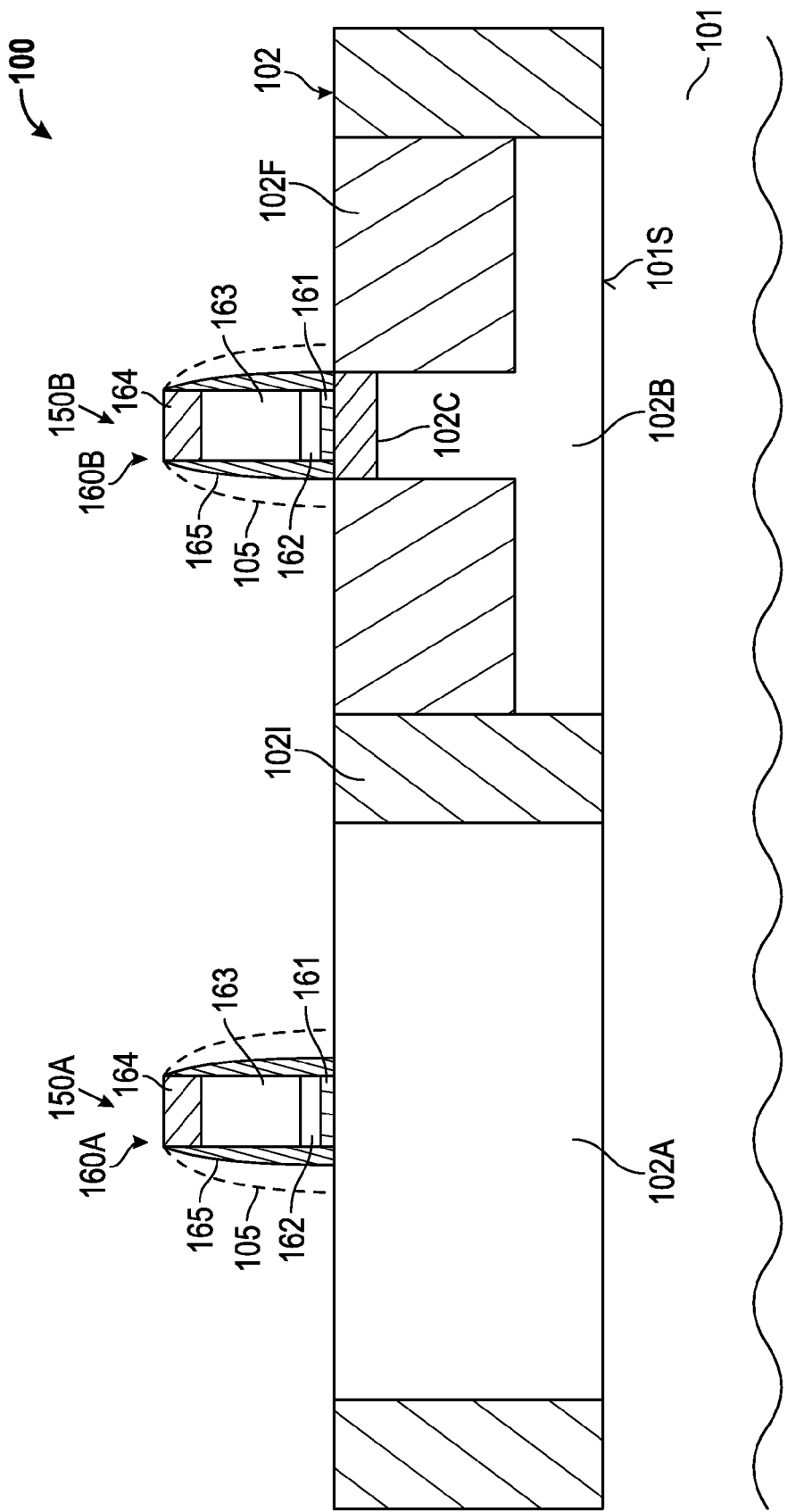
FIGS. 1a-1h are cross-sectional views of transistor structures illustrating methods for fabricating an integrated circuit in accordance with embodiments of the present disclosure.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based integrated circuits are well known and so, in the interest of brevity, many conventional steps will only be mentioned briefly herein or will be omitted entirely without providing the well-known process details.

Techniques and technologies described herein may be utilized to fabricate MOS transistor devices, including NMOS transistor devices, PMOS transistor devices, and NMOS/PMOS device combinations referred to as CMOS devices. Although the term "MOS device" properly refers to a device having a metal gate electrode and an oxide gate insulator, that term will be used throughout to refer to any semiconductor device that includes a conductive gate electrode (whether metal or other conductive material) that is positioned over or around a gate insulator (whether oxide or other insulator) which, in turn, is positioned over a semiconductor region or regions. Various steps in the manufacture of MOS components are well known and so, in the interest of brevity, many conventional steps will only be mentioned briefly herein or will be omitted entirely without providing the well-known process details.

The present disclosure generally contemplates manufacturing techniques and semiconductor devices in which the variability of transistor characteristics, and in particular transistor variabilities caused by interstitial defects and dopant diffusion in the drain and source regions, may be reduced by co-implanting fluorine with the dopant in N-channel transistors, i.e., NMOS transistors. The fluorine is implanted after implanting the source/drain extension and halo regions, and the fluorine is preferably implanted at least in the halo region. Embodiments of the present disclosure find particular application in integrated circuits employing high-k metal gate technologies, and in particular 28 nm and small high-k metal gate technologies.

The following embodiments are not limited by the type of semiconductor substrate employed or the particular methods/techniques used to fabricate the transistor structures thereon (for example, the methods/techniques used to implant the source/drain regions). Thus, the embodiments set forth below include several examples of suitable substrates and several examples of suitable source/drain techniques in order to demonstrate the breadth of the applicability of the fluorine implantation techniques described herein. As such, those skilled in the art will understand that the following exemplary embodiments, at least with regard to the semiconductor substrates disclosed and the particular methods steps for fabricating the transistors disclosed should not be interpreted as limiting, but rather as suitable examples of methods/techniques that can benefit from the co-implantation of fluorine in the source/drain regions.

FIG. 1a schematically illustrates a cross-sectional view of a semiconductor device 100 which may include a substrate 101 in combination with a semiconductor layer 102, which may be divided into several semiconductor regions or active regions 102A, 102B by appropriately dimensioned isolation regions 1021, provided for instance in the form of a shallow trench isolation. Moreover, in some illustrative embodiments, the active regions 102A, 102B may be provided in the form of an SOI architecture in which a buried insulating material (not shown) may connect to the active regions 102A, 102B, thereby forming an interface 1015, which may thus represent an insulating area in the "vertical" direction. It should be appreciated that an active region is to be understood as a region in and above which one or more transistors are to be provided. For example, in the embodiment shown, the active region 102A may be used to form a first transistor 150A, such as a P-channel transistor, while the active region 102B may be used to provide a complementary transistor, such as a transistor 150B in the form of a N-channel transistor, thus forming a CMOS device. In the manufacturing stage shown, the active region 102A may represent basically a semiconductor material of homogeneous composition, except for any well implantation species, which may define the basic electronic characteristics of the active region 102A. The active region 102B may, in some illustrative embodiments, include an additional performance enhancing mechanism, for instance in the form of a strained or strain-inducing semiconductor material 102F, which in some illustrative embodiments may be provided in the form of a silicon/germanium alloy, as is also discussed above. Of course, both active regions 102A and 102B could be homogeneous semiconductor materials, or both could include strain inducing features. The invention is not limited to the substrate employed, rather several substrate options are shown for breadth of description. Furthermore, in some illustrative embodiments, the active region 102B may further include, at least at a portion thereof, a threshold adjusting semiconductor material 102C, such as a silicon/germanium material, which may be required for appropriately adapting the band gap with respect to a gate electrode structure 160B in order to obtain a desired threshold voltage of the transistor 150B. For example, the gate electrode structure 160B may represent a sophisticated high-k metal gate electrode structure, wherein an appropriate work function of the gate electrode structure 160B in combination with the electronic characteristics of the threshold adjusting semiconductor material 102C may result in the desired threshold voltage for the transistor 150B. Of course, this threshold feature 102C is merely optional, and need not be included. It should be appreciated, however, that, in other illustrative embodiments, the active regions 102A, 102B may have a similar configuration, except for any differences required for adjusting the basic transistor characteristics.

Moreover, as shown, the gate electrode structures 160A and 160B may include a gate dielectric material 161, which may include any appropriate dielectric material, such as a conventional gate dielectric material in the form of silicon oxide, silicon oxynitride and the like, while in other cases the gate dielectric material 161 may include a high-k dielectric material, such as hafnium oxide and the like, in order to enhance the overall electronic characteristics of the gate electrode structures 160A and 160B. In some embodiments, a metal-containing electrode material 162 may be formed above the gate dielectric material 161 and may have any appropriate configuration so as to impart a desired work function to the gate electrode structures 160A and 160B, possibly in combination with any work function species contained in the layer 162 and/or the layer 161. Moreover, a further electrode material 163, typically provided in the form of amorphous or polycrystalline silicon, may be provided in combination with a dielectric cap layer 164, such as a silicon nitride material, a silicon dioxide material, or any combination thereof. Moreover, a spacer element or spacer structure 165 may be provided so as to confine, in combination with the dielectric cap layer 164, the sensitive gate materials 163, 162 and 161.

Similarly, the transistor 150A may include a gate electrode structure 160A, which may have basically the same configuration as the gate electrode structure 160B, wherein, however, due to any pattern non-uniformities, certain differences may exist, while also the material layers 161 and 162 may provide the desired threshold voltage for the transistor 150A, which may require the incorporation of appropriate metal species and the like.

The semiconductor device 100 as illustrated in FIG. 1a may be formed on the basis of the following processes. After providing the isolation structure 102I using well-established lithography, etch, deposition and planarization techniques, the basic well dopant species may be incorporated into the active regions 102A, 102B, which have been laterally delineated by providing the isolation structure 102I. To this end, any well-established implantation techniques and masking regimes may be applied. Thereafter, if required, the threshold adjusting semiconductor material 102C may be formed selectively in the active region 102B, followed by a complex deposition and patterning sequence for forming an appropriate gate layer stack and patterning the same so as to obtain the gate electrode structures 160A, 160B. For this purpose, appropriate materials for the gate dielectric material, possibly including a high-k material, as discussed above, and for the metal-containing electrode materials 162 may be applied, thereby also providing appropriate metal species in order to adjust the work functions for the gate electrode structures 160A, 160B differently in accordance with the corresponding transistor requirements. Next, the material 163 and the one or more materials of the dielectric cap layer 164 are provided, possibly in combination with additional sacrificial materials, as are required for patterning the resulting gate stack, which may involve one or more lithography steps and corresponding etch processes. Thereafter, the spacer structure 165 may be formed by using well-established low pressure chemical vapor deposition (CVD), multi-layer deposition recipes and the like. After patterning the resulting layer stack, a further spacer layer may be provided and may be patterned so as to cover the active regions 102A and 102B, while forming appropriate spacers on sidewalls of the gate electrode structure 160B. Thereafter, cavities may be formed in the active regions 102A and 102B and the material 102F, if provided, may be formed on the basis of selective epitaxial growth techniques. Thereafter, the spacer layer may be patterned into the spacer structure 165 for the gate electrode structure 160A, while in other cases the corresponding spacer layer may be removed together with any additional spacer element provided on sidewalls of the gate electrode structure 160B, depending on the overall process strategy. It should be appreciated that, in other cases, the additional process steps for implementing the strain-inducing semiconductor material 102F may be omitted if a corresponding strain-inducing mechanism is not required.

In some illustrative embodiments, as illustrated by the dashed lines, an optional sacrificial spacer structure or element 105 may be provided so as to act as a protective structure for the spacer 165, since typically the spacer structure 165 may be formed of a similar material as the dielectric cap layer 164, which may have to be removed during the further processing. In this manner, the sacrificial spacer 105 may act as an efficient etch mask. To this end, any well-established process techniques may be applied, for instance, depositing a silicon dioxide material or any other appropriate dielectric material having the required etch resistivity with respect to an etch chemistry that is appropriately selected in order to remove the dielectric cap layer 164. For example, amorphous carbon may also be efficiently used as material for the sacrificial spacer structure 105.

Figure 1B:
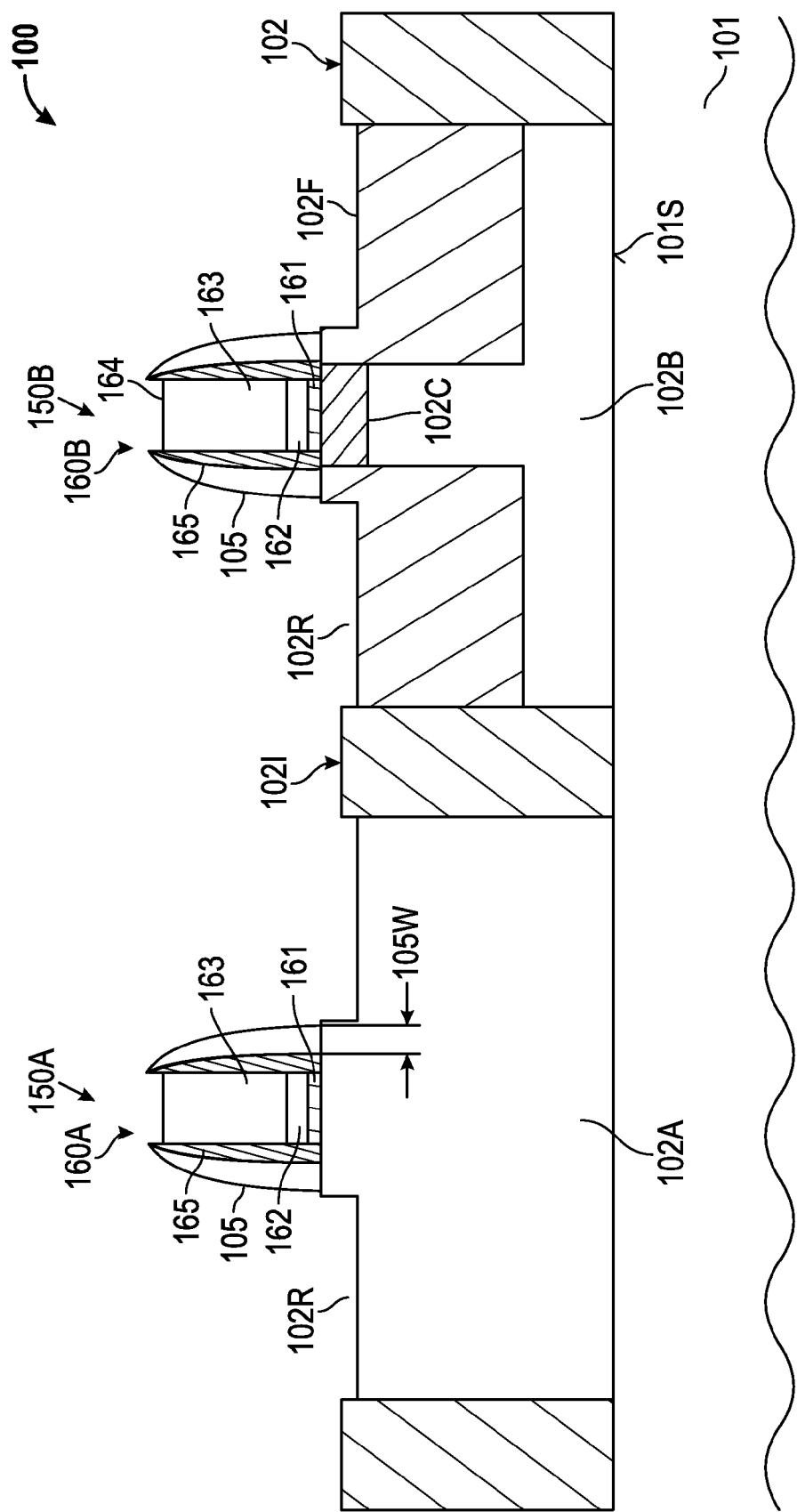

FIG. 1b schematically illustrates the semiconductor device 100 in a further advanced manufacturing stage according to some illustrative embodiments. In these embodiments, the dielectric cap layer 164 (FIG. 1a) is removed on the basis of any appropriate etch strategy, for instance by using plasma-based etch recipes, wet chemical etch recipes and the like. As discussed above, during the corresponding removal process, the sacrificial spacer structure 105 may act as an etch mask in order to avoid undue material removal of the spacer structure 165, which in turn may act as a reliable protective material during the further processing of the device 100 in view of sensitive gate materials, such as the materials 161 and 162. During the corresponding removal process, also a certain amount of material may be removed from the active regions 102A, 102B, as indicated by the corresponding recesses 102R.

Figure 1C:
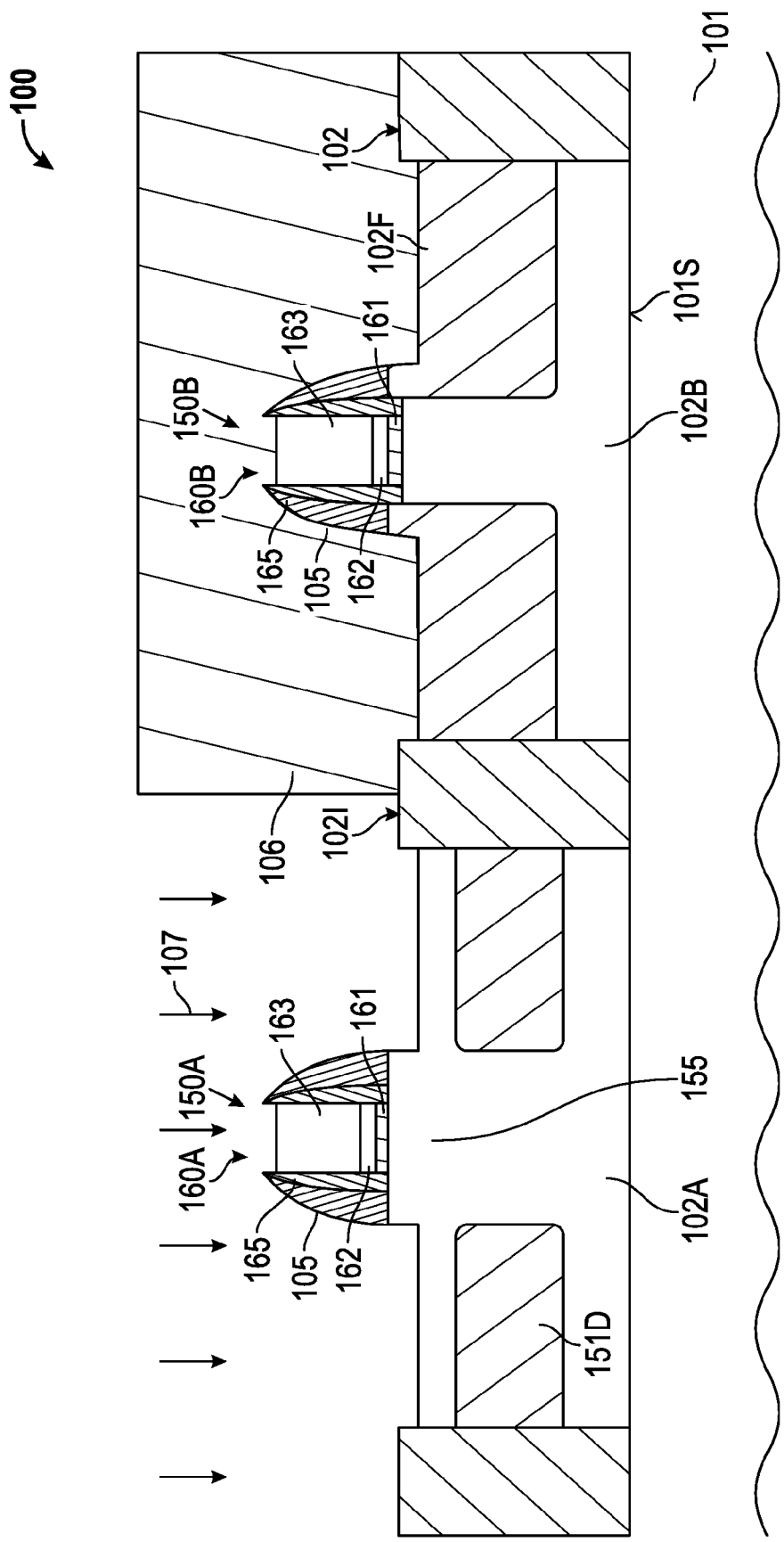

FIG. 1c schematically illustrates the semiconductor device 100 in a further advanced manufacturing stage. As illustrated, an implantation mask 106, such as a resist mask, is provided above the active region 102B and the gate electrode structure 160B. On the other hand, the active region 102A is exposed to an ion implantation process 107, whose process parameters are selected so as to incorporate the dopant species for forming deep drain and source regions 151D of the transistor 150A. In some illustrative embodiments, a P-type dopant species may be incorporated during the process 107, wherein the spacer structure 105 in combination with the gate electrode structure 160A may act as an implantation mask.

Figure 1D:
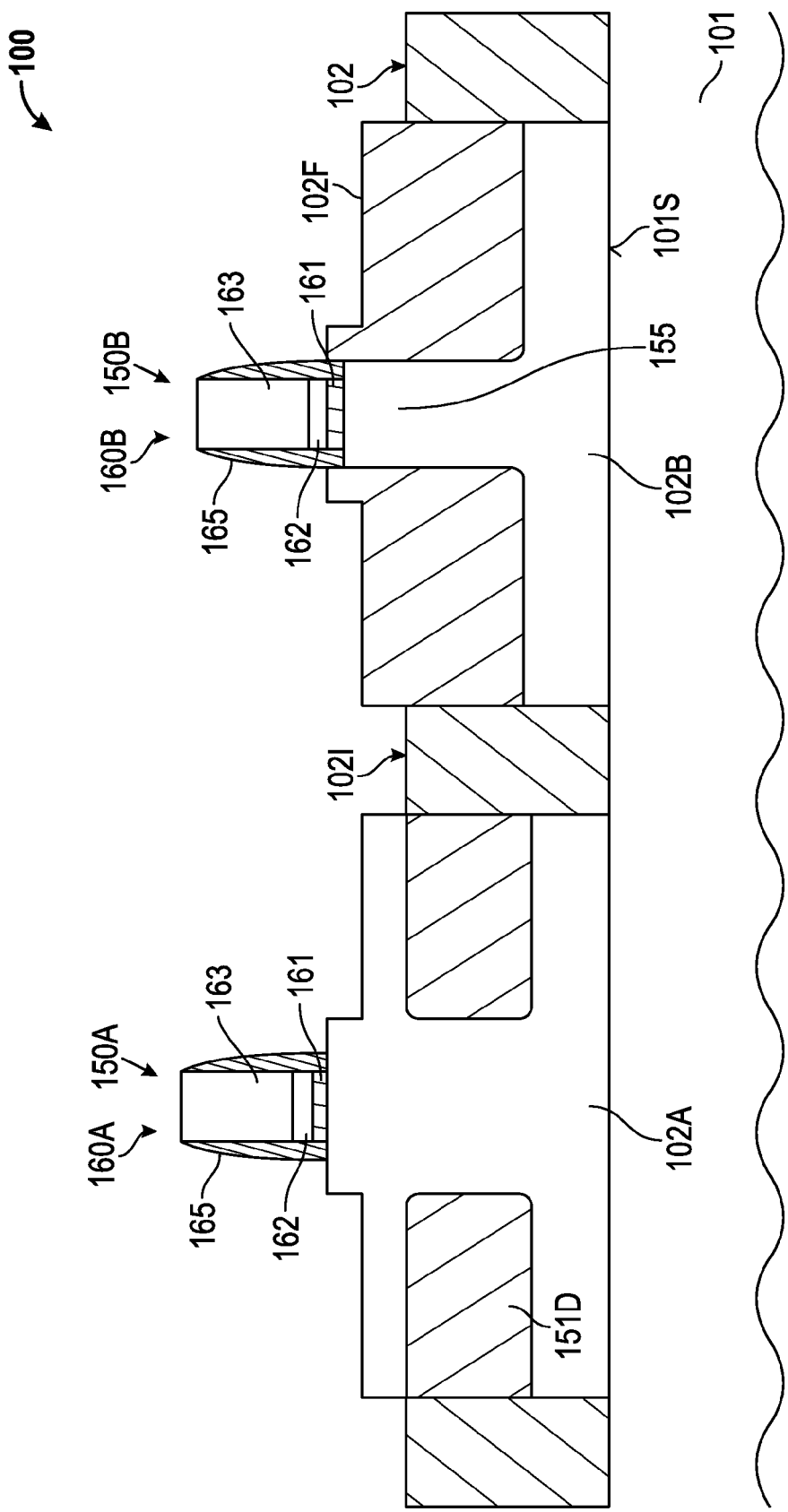

FIG. 1d schematically illustrates the semiconductor device 100 in a further advanced manufacturing stage, i.e., after the removal of the implantation mask 106 and after the removal of the sacrificial spacer structure 105 (FIG. 1c). Consequently, in this manufacturing stage, the spacer structure 165 or any other appropriate spacer structure may be used, together with the gate electrode structures 160A, 160B, as implementation masks for forming shallow drain and source extensions regions and any counter-doped regions or halo regions, which typically require a reduced lateral offset with respect to the electrode material of the gate electrode structures 160A, 160B in order to actually determine a channel length in the channel region 155. The removal of the implantation mask 106 and of the spacer structure 105 (FIG. 1c) may be accomplished by any well-established process strategies, such as oxygen plasma, wet chemical resist strip processes, in combination with selective etch recipes for removing silicon dioxide material, amorphous carbon material and the like, depending on the material composition of the sacrificial spacer structure 105.

Figure 1E:
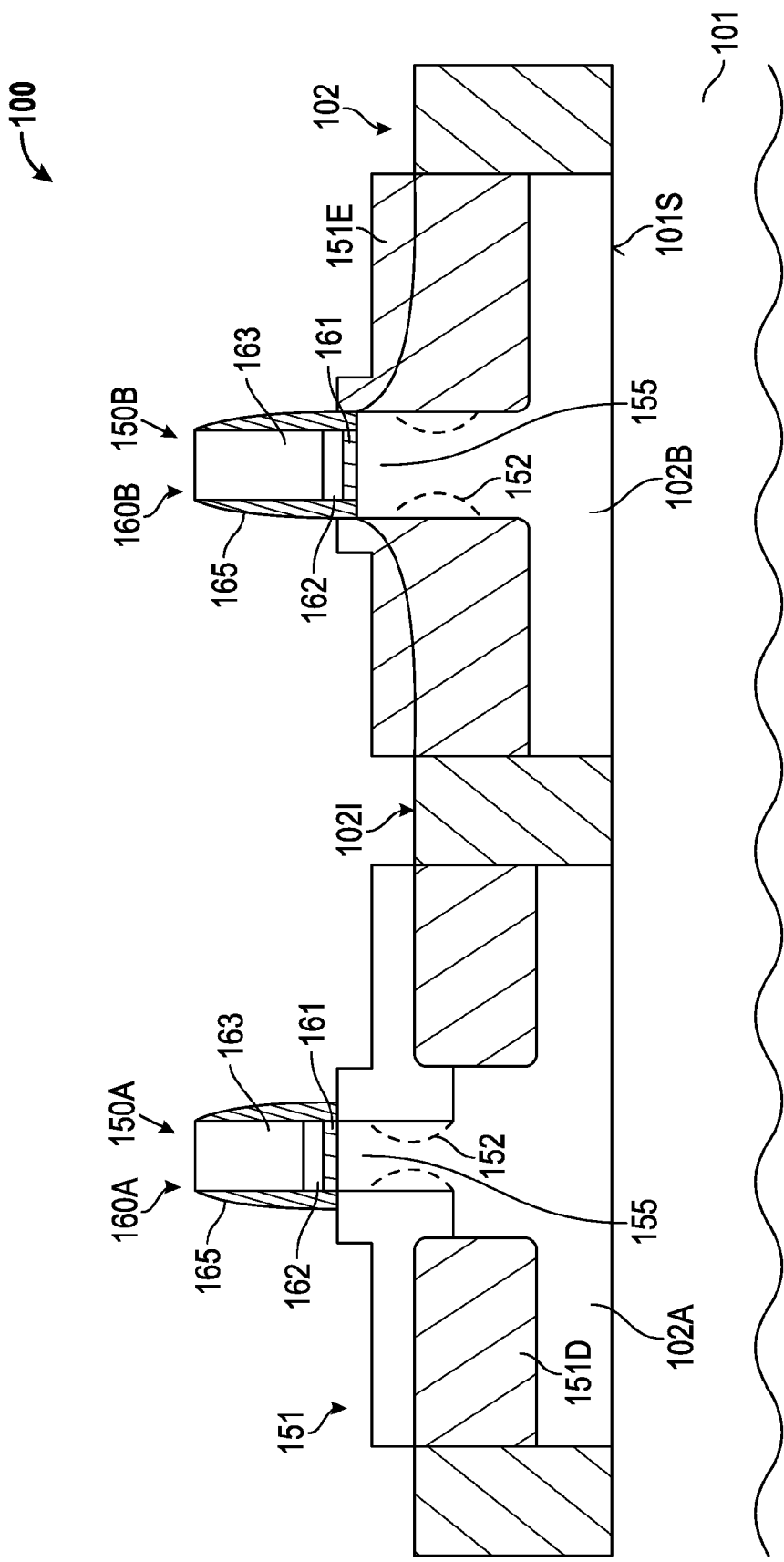

FIG. 1e schematically illustrates the semiconductor device 100 in a further advanced manufacturing stage. As illustrated, drain and source regions 151 are formed in the active region 102A and include the deep drain and source regions 151D, previously formed on the basis of the spacer structure 105 and the implantation process 107 (FIG. 1c), and drain and source extension regions 151E, which may represent highly doped yet very shallow dopant profiles. As indicated, since the extension regions 151E may be formed on the basis of the spacer structure 165, the lateral offset from the channel region 155 may be less compared to the deep drain and source regions 151D. Moreover, in the manufacturing stage shown, also counter-doped regions or halo regions 152 may be provided at an appropriate depth and with a desired lateral offset as defined by the overall transistor characteristics of the transistor 150A. Similarly, drain and source extension regions 151E may be formed in the active region 102B so as to comply with the requirements of the transistor 150B. Moreover, corresponding counter-doped or halo regions 152 may be provided for the transistor 150B. It should be appreciated that if the transistors 150A, 150B represent complementary transistors, the corresponding dopings of the drain and source extension regions 151E may be inverse for the transistors 150A, 150B, likewise the doping of the halo regions 152 may be inverse for the transistors 150A, 150B.

The corresponding drain and source extension regions 151E and the corresponding halo regions 152 may be formed on the basis of any appropriate implantation sequences in combination with an appropriate masking regime so as to alternately cover the transistors 150A, 150B in order to incorporate the appropriate dopant species in the corresponding non-masked transistor.

It will be appreciated that the above described methods of deep source/drain implantation in active region 102A followed by extension/halo region deposition in active region 102B is provided in connection with an embodiment wherein it is desired to have differently spaced source/drain regions for the NMOS and PMOS devices, as will be described in greater detail below. However, in a simpler embodiment, the implantation procedure described in FIG. 1c for active region 102A may simply be repeated for the active region 102B, and thereafter the source/drain extension/halo regions implanted for each device, as described above. Again, the embodiments herein should not be understood as limited by any spacing of the source/drain features. Rather, the various embodiments are provided for breadth of description.

Figure 1F:
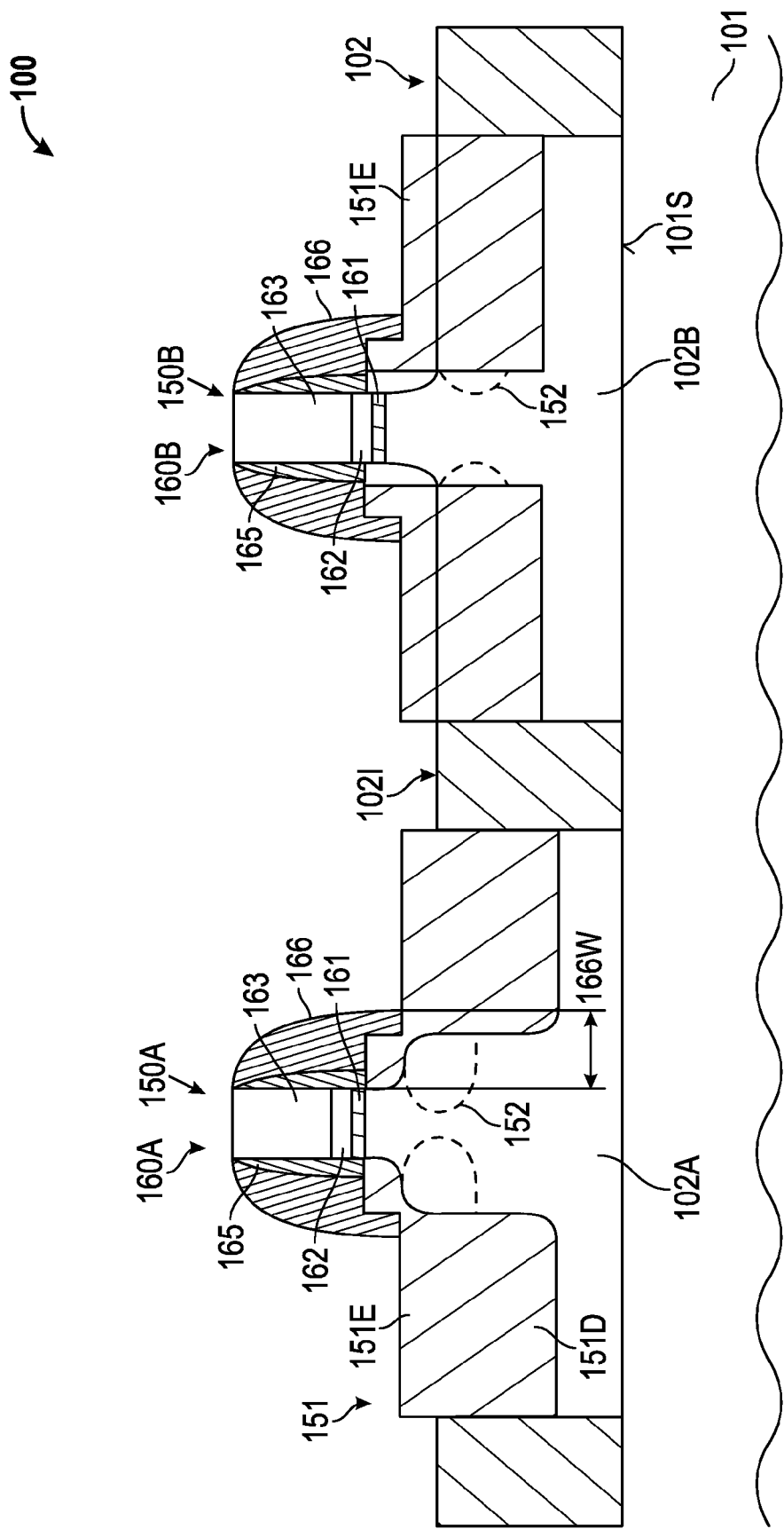

Continuing in the description of the embodiment, FIG. 1f schematically illustrates the semiconductor device 100 in a further advanced manufacturing stage. As illustrated, a spacer element or spacer structure 166 may be provided at sidewalls of the gate electrode structures 160A, 160B, wherein the spacer or spacer structure 166 may have an appropriate spacer width 166W that, in combination with the spacer structure 165, may provide a desired lateral offset for forming deep drain and source areas in the active region 102B so as to comply with the corresponding transistor characteristics. For example, in the embodiment shown in FIG. 1f, it may be assumed that an increased spacer width 166W may be required compared to the width of the spacer structure 105 as used during the implantation process 107 (FIG. 1c). A corresponding increased spacer width may be desirable (though not required) in some embodiments due to an increased diffusion activity of a corresponding dopant species. Consequently, during a corresponding manufacturing strategy for providing the spacer or spacer structure 166, the initial layer thickness of the spacer material and the etch process parameters may be appropriately selected so as to obtain the required spacer width 166W. To this end, any well-established process techniques may be applied. Thus, an individual adjustment with respect to the requirements of the transistor 150B may be accomplished for the subsequent implantation process when incorporating a further drain and source dopant species into the active region 102B, while on the other hand the lateral dopant profile of the deep drain and source regions 151D of the transistor 150A have been adjusted on the basis of the spacer structure 105, as shown in FIG. 1c.

Figure 1G:
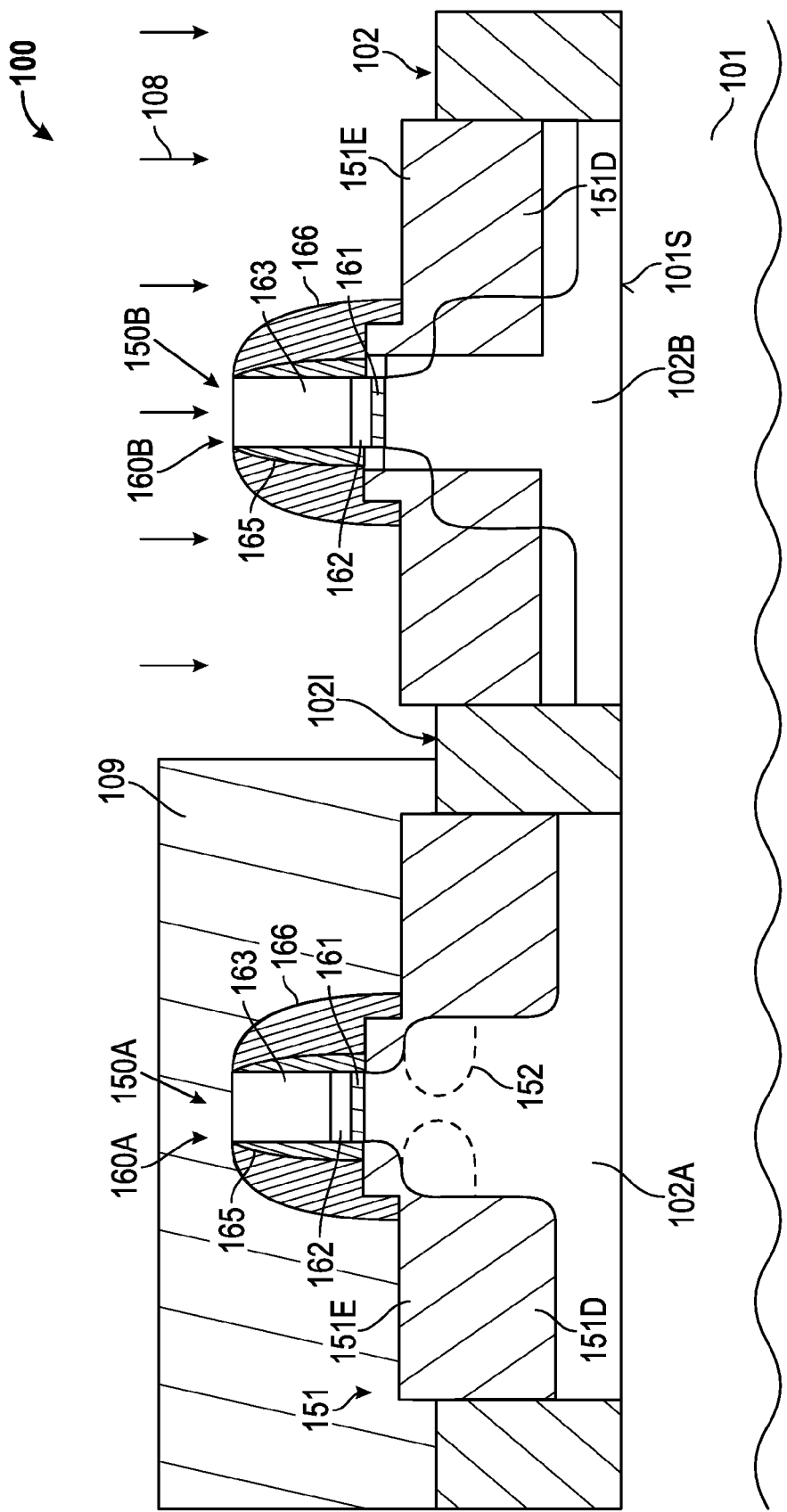

FIG. 1g schematically illustrates the semiconductor device 100 in a manufacturing stage in which the transistor 150A (PMOS) may be covered by an implantation mask 109, such as a resist material, while the transistor 150B is exposed to an implantation process 108 in which an appropriate dopant species may be incorporated into the active region 102B in order to form deep drain and source regions 151D therein. Thus, during the implantation process 108, the gate electrode structure 160B in combination with the spacer structure 166 having the desired spacer width act as an implantation mask for defining the desired lateral offset of the regions 151D. In some illustrative embodiments, an N-type dopant species may be incorporated during the process 108. Of course, in examples where lateral offset is not required the implantation process 108 could occur substantially as shown in FIG. 1c (but at the active region 102B).

Continuing the example shown in FIG. 1g wherein the transistor 150A represents a P-channel transistor and the transistor 150B represents an N-channel transistor, it may be desirable to co-implant a fluorine species into the source/ drain regions 151 of transistor 150B as part of the illustrated implantation process 108. As noted above, current dopants used the source/drain regions have been known to cause interstitial defects in the semiconductor substrate, thus reducing device performance. Further, the dopants, once implanted, have been known to diffuse through the semiconductor substrate, thus also reducing device performance. Thus, it is desirable to reduce the incidence of interstitial defects and undesirable diffusion in a NMOS transistor by the co-implantation of the fluorine species.

Fluorine may also be implanted into the substrate at this juncture, either as part of the source/drain region implantation process or as a separate process before or after the formation of the source and drain regions. In one example, the fluorine is implanted after the completion of the source/drain extension and halo implants, as indicated in FIG. 1g (which was completed, in this particular example, at FIG. 1e). For example, a fluorine gas may be ionized and then implanted into the substrate via separate ion beams as indicated by arrows 108 in FIG. 1g. In another example, the fluorine is implanted in a separate implantation step that occurs before the procedure describe in FIG. 1c. As such, it will be appreciated that the fluorine implantation can generally occur at any point in the formation of the source/drain regions, such as before any source/drain formation begins, or after the formation of the halo and extension regions.

The fluorine is implanted at a dose that is typically the same or less than the dose utilized to form the source and/or drain regions. For example, the fluorine can be implanted at a dose from about 4.0E14 atoms per square centimeter and about 1.0E15 atoms per square centimeter, such as about 7.0E14 atoms per square centimeter. It is to be appreciated that the fluorine implant can be any ionized form that can introduce fluorine (e.g., atomic (F), molecular ($F_2$), or other cluster/molecular ions). Preferably, the fluorine is implanted at an energy of about 8 to about 10 keV, such that the fluorine is implanted in the same area as the halo implant region 152.

Thereafter, the final configuration of the drain and source regions 151 for the transistors 150A, 150B may be adjusted by performing one or more anneal processes in accordance with appropriately selected process parameters, wherein a certain degree of dopant diffusion may be induced, which in turn may result in the desired final vertical and lateral dopant profile.

Figure 1H:
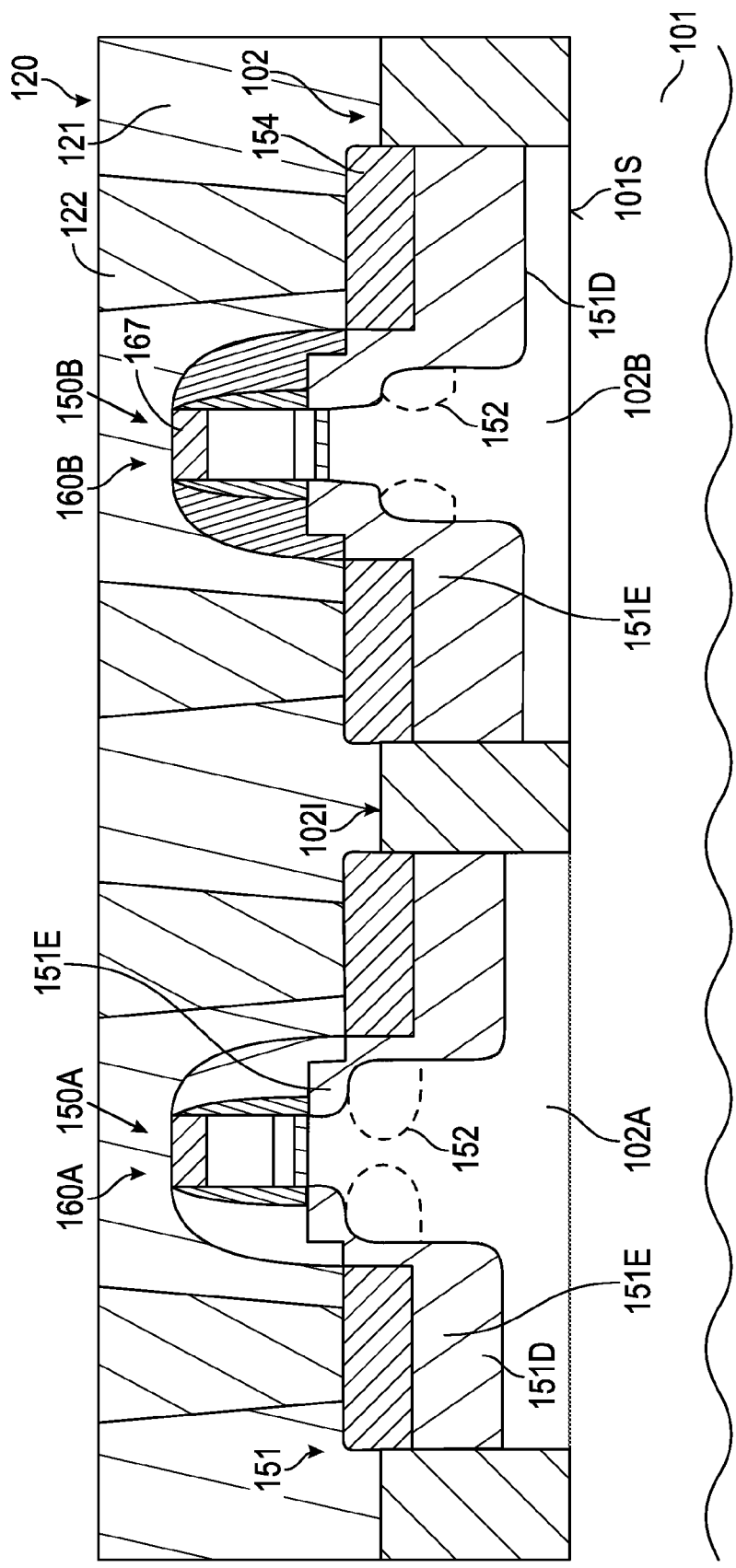

FIG. 1h schematically illustrates the semiconductor device 100 in a further advanced manufacturing stage. As illustrated, metal/semiconductor compounds 154 may be provided in the drain and source regions 151, while in some illustrative embodiments also a metal/semiconductor compound 167 may be provided in the gate electrode structures 160A, 160B. Furthermore, a contact level 120, for instance including one or more dielectric materials 121, such as silicon nitride, silicon dioxide and the like, may be provided so as to enclose and thus passivate the transistors 150A, 150B. Moreover, the contact level 120 may include a plurality of contact elements 122, which may connect to the corresponding contact regions of the transistors 150A, 150B, such as the drain and source regions 151. For example, the contact elements 122 may connect to the metal/semiconductor compound 154.

The semiconductor device 100 as shown in FIG. 1h may be formed on the basis of any well-established and appropriate process strategy. For example, after any anneal processes for activating the dopant species and inducing a certain degree of dopant diffusion for adjusting the final profile of the drain and source regions 151, and also of the halo regions 152, the metal/semiconductor compounds 154, possibly in combination with the compounds 167, may be formed in accordance with well-established process techniques, such as silicidation regimes and the like. Thereafter, the one or more materials of the dielectric material or material system 121 may be deposited and planarized, followed by the patterning of these materials in order to form respective openings, which may subsequently be filled with any appropriate contact metal, such as tungsten and the like, depending on the overall process and device requirements.

Figure 2A:
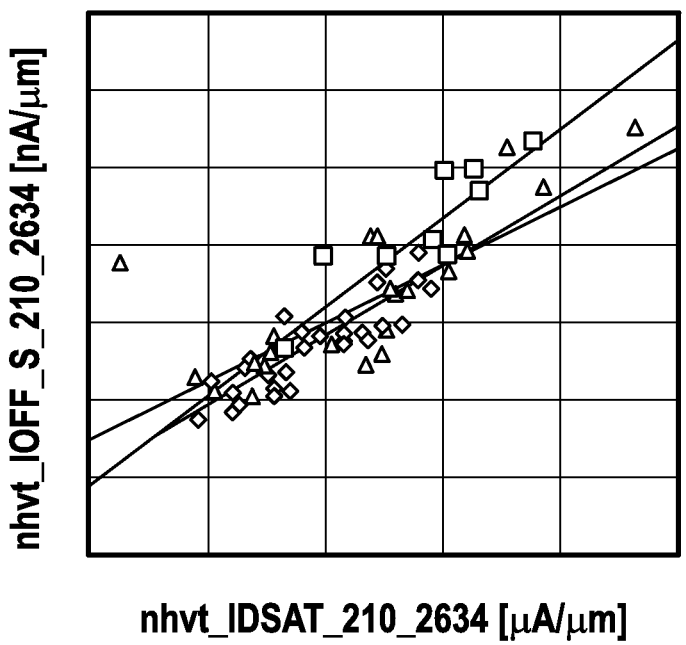
FIGS. 2a-2b are graphs illustrating the performance benefits of integrated circuits fabricated in accordance with embodiments of the present disclosure.
Figure 2B:
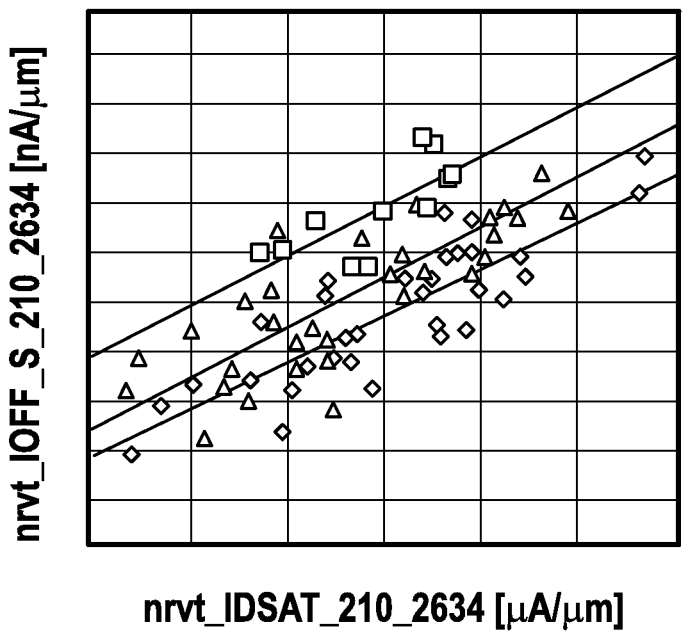

FIGS. 2a and 2b are graphs illustrating the performance improvements achieved by embodiments of the present disclosure. FIGS. 2a and 2b illustrate the Off current versus the On current in a convention device and two devices prepared in accordance with the present disclosure. Comparing the plotted lines in both FIGS. 2a and 2b, it is clear that the examples prepared in accordance with the present disclosure exhibit superior current performance.

Thus, it will be appreciated that the embodiments described herein provide integrated circuits with small-scale transistor structures and methods for fabricating the same with improved carrier mobility and drive current. Further, the described embodiments provide methods for fabricating integrated circuits that reduce interstitial defects and dopant diffusion in the source/drain regions. The methods require merely a simple process change in the incorporation of a fluorine implant process after the source/drain extension and halo implant processes.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating an integrated circuit comprising:
    forming a first gate electrode structure above a first active region and a second gate electrode structure above a second active region;
    forming a first spacer on sidewalls of the first and second gate electrode structures and a second spacer on sidewalls of the second gate electrode structure;
    forming deep drain and source regions selectively in the second active region by using the second spacer as an implantation mask;
    forming drain and source extension and halo regions in the first and second active regions after removal of the second spacer;
    forming a third spacer on sidewalls of the first gate electrode structure; and
    forming a fluorine implant region in the first active region after formation of the drain and source extension and halo regions and after formation of the third spacer,
    wherein forming the fluorine implant region comprises forming a fluorine implant region with a concentration of about 4.0E14 atoms per square centimeter to about 1.0E15 atoms per square centimeter, and
    wherein forming the fluorine implant region comprises implanting fluorine at an energy of about 8 to about 10 keV.

2. The method of claim 1, wherein forming the fluorine implant region comprises ionizing elemental fluorine for implantation into the first active region.

3. The method of claim 1, wherein forming the fluorine implant region comprises forming a fluorine implant region with a concentration of about 7.0E14 atoms per square centimeter.

4. The method of claim 1, wherein the first gate electrode structure is an NMOS device.

5. The method of claim 1, wherein the second gate electrode structure is a PMOS device.

6. The method of claim 1, wherein the source/drain region of the NMOS device are formed so as to have a different lateral offset as compared to the PMOS device.

7. The method of claim 1, wherein the source/drain regions of the NMOS device are formed so as to have the same lateral offset as compared to the PMOS device.

8. The method of claim 1, wherein the first and second gate electrode structures comprise high-k metal gate devices.

9. A method for fabricating an integrated circuit comprising:
   forming a first gate electrode structure above a first active region and a second gate electrode structure above a second active region;
   forming a first spacer on sidewalls of the first and second gate electrode structures and a second spacer on sidewalls of the second gate electrode structure;
   forming deep drain and source regions selectively in the second active region by using the second spacer as an implantation mask;
   forming drain and source extension and halo regions in the first and second active regions after removal of the second spacer;
   forming a third spacer on sidewalls of the first gate electrode structure; and
   forming a fluorine implant region in the first active region after formation of the drain and source extension and halo regions and after formation of the third spacer.

* * * * *